(12) United States Patent
Shan

(10) Patent No.: US 11,561,474 B2
(45) Date of Patent: Jan. 24, 2023

(54) PREBAKING DEVICE AND PREBAKING SYSTEM FOR DISPLAY SUBSTRATE

(71) Applicant: HKC Corporation Limited, Guangdong (CN)

(72) Inventor: Jianfeng Shan, Guangdong (CN)

(73) Assignee: HKC Corporation Limited, Shenzhen (CN)

( * ) Notice: Subject to any disclaimer, the term of this patent is extended or adjusted under 35 U.S.C. 154(b) by 932 days.

(21) Appl. No.: 16/347,937

(22) PCT Filed: Dec. 20, 2017

(86) PCT No.: PCT/CN2017/117317
§ 371 (c)(1),
(2) Date: May 7, 2019

(87) PCT Pub. No.: WO2019/071820
PCT Pub. Date: Apr. 18, 2019

(65) Prior Publication Data
US 2019/0285987 A1    Sep. 19, 2019

(30) Foreign Application Priority Data
Oct. 12, 2017   (CN) .......................... 201710947510.3

(51) Int. Cl.
*G03F 7/38*      (2006.01)
*G02F 1/13*      (2006.01)
*G03F 7/40*      (2006.01)

(52) U.S. Cl.
CPC .................. *G03F 7/38* (2013.01); *G02F 1/13* (2013.01); *G03F 7/40* (2013.01)

(58) Field of Classification Search
None
See application file for complete search history.

(56) References Cited

U.S. PATENT DOCUMENTS

2001/0055731 A1* 12/2001 Irie ........................... G03F 7/38
430/324
2008/0143980 A1* 6/2008 Nakano ............... G03F 7/70341
355/27

(Continued)

FOREIGN PATENT DOCUMENTS

CN    205450562 U  *  8/2016
JP    2004330507 A  *  11/2004

OTHER PUBLICATIONS

International Search Report of PCT Patent Application No. PCT/CN2017/117317 dated Aug. 16, 2018.

*Primary Examiner* — Ryan Crockett

(57) ABSTRACT

The disclosure provides a prebaking device and a prebaking system for display substrate. The prebaking device includes a top plate, a bottom plate, a first side plate, a second side plate, a third side plate defined opposite to the first side plate and a fourth side plate defined opposite to the second side plate, the top plate, the bottom plate, the first side plate, the second side plate, the third side plate and the fourth side plate form a chamber cooperatively, the first side plate is defined with a window, the second side plate is defined with an air inlet hole to connect an air supply pipe of a hot air system, the fourth side plate is defined with an air exhaust hole to connect an exhaust system, the inner surface of the top plate is defined with an anti-adhere film.

18 Claims, 2 Drawing Sheets

(56) References Cited

U.S. PATENT DOCUMENTS

| | | | |
|---|---|---|---|
| 2016/0121364 A1* | 5/2016 | Liu | G06F 3/041 |
| | | | 118/641 |
| 2018/0329304 A1* | 11/2018 | Huang | G03F 7/40 |
| 2019/0058167 A1* | 2/2019 | He | H01L 51/0029 |

* cited by examiner

PREBAKING DEVICE AND PREBAKING SYSTEM FOR DISPLAY SUBSTRATE

FIELD

The present disclosure relates to the field of display technology, and in particular relates to a prebaking device and a prebaking system for display substrate.

BACKGROUND

In the manufacturing process of display substrate, prebaking is required after a photoresist process to evaporate the solvent inside the photoresist, which is beneficial to the subsequent exposure and development processes. In addition, with the development of liquid crystal display panel to high resolution, the pigment used in the photoresist is granulated to improve color saturation, because only the pigment particles being thinned may ensure higher filtration, contrast, and chroma, etc. Therefore, when dispersing the pigment particles, it is common to add various blending agents and photochemical agents to ensure dispersion of the pigment particles, while, this causes more solvent vapor in the prebaking stage at the same time. If this solvent vapor cannot be exhausted well, the yield and quality of the product will be badly affected.

SUMMARY

The present disclosure provides a prebaking device and a prebaking system for display substrate, which can improve the product yield and quality of the display substrate.

In one aspect, an embodiment of the present disclosure provides a prebaking device for display substrate, the prebaking device defines a chamber therein, the inner wall of the chamber is defined with an anti-adhesive film, a side surface of the chamber is defined with:

a window, the surface of the window being defined with an anti-adhesive film;

an air inlet hole, being configured to connect an air supply pipe of a hot air system; and an air exhaust hole, being configured to connect an air exhaust pipe of an exhaust system.

In another aspect, an embodiment of the present disclosure also provides a prebaking system for display substrate, the prebaking system includes:

a hot air system;

an air exhaust system;

a prebaking device, the prebaking device defining a chamber therein, the inner wall of the chamber being defined with an anti-adhesive film, a side surface of the chamber being defined with:

a window, the surface of the window being defined with an anti-adhesive film;

an air inlet hole, being configured to connect an air supply pipe of a hot air system; and an air exhaust hole, being configured to connect an air exhaust pipe of an exhaust system.

In still another aspect, an embodiment of the present disclosure also provide a prebaking system for display substrate, the prebaking system includes:

a hot air system;

an air exhaust system;

a prebaking device, the prebaking device defining a chamber therein, the inner wall of the chamber being defined with an anti-adhesive film, a side surface of the chamber being defined with:

a window, the surface of the window being defined with an anti-adhesive film;

an air inlet hole, being configured to connect an air supply pipe of a hot air system; and an air exhaust hole, being configured to connect an air exhaust pipe of an exhaust system.

Each amount of the air exhaust hole and the air inlet hole is 6, each air exhaust hole is aligned with one air inlet hole correspondingly, the window is a blind window, a side of the blind window facing the chamber is defined with the film, the film has acid-base resistance and electrical isolation, and the temperature that the film resists is greater than or equal to 200° C.

The prebaking device and the prebaking system for display substrate according to the present disclosure, the prebaking device defines a chamber therein, the inner wall of the chamber is defined with an anti-adhesive film, a side surface of the chamber is defined with: a window; an air inlet hole, configured to connect an air supply pipe of a hot air system; an air exhaust hole, configured to connect an air exhaust pipe of an exhaust system. The top surface of the chamber of the prebaking device is defined with an anti-adhesion film. When the prebake display substrate is to evaporate the photoresist solvent, the volatilized solvent vapor will not adhere to the top of the chamber, thus improving the product yield of display substrate and reducing the production cost.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only about some embodiments of the present invention, and persons of ordinary skill in the art can derive other drawings from the accompanying drawings without creative efforts.

DETAILED DESCRIPTION OF THE EMBODIMENTS

The technical solutions of the embodiments of the present disclosure will be clearly and completely described in the following with reference to the drawings. It is obvious that the embodiments to be described are only a part rather than all of the embodiments of the present disclosure. All other embodiments obtained by persons skilled in the art based on the embodiments of the present disclosure without creative efforts shall fall within the protection scope of the present disclosure.

It should be understood that when used in this specification and the appended claims, the terms "comprising" and "including" indicate the presence of the described features, integers, steps, operations, elements, and/or components, but do not exclude the presence or addition of one or more other features, integers, steps, operations, elements, components, and/or groups thereof.

Figure 1:
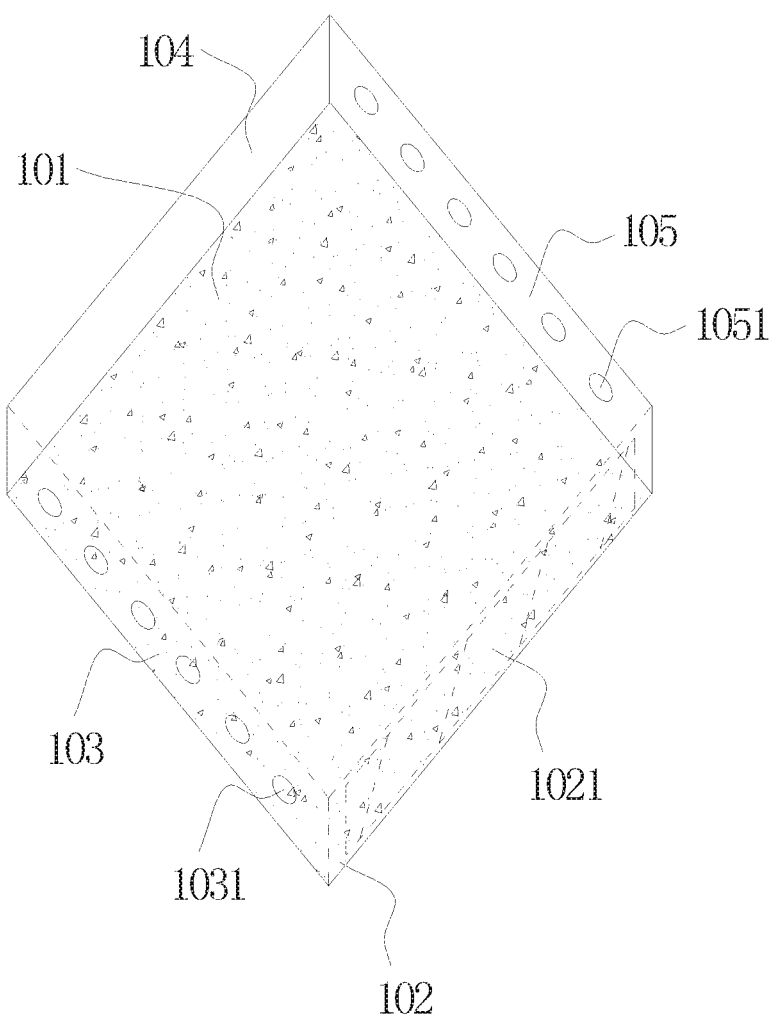
FIG. 1 is a schematic structural diagram of a prebaking device for display substrate provided by an embodiment of the present disclosure.

Please referring to FIG. 1, FIG. 1 is a prebaking device 100 for display substrate provided in an embodiment of the present disclosure, the prebaking device 100 is applied for such as manufacturing process of a liquid crystal display panel, an OLED display panel, a QLED display panel, a curved display panel, or other display panels. The display substrate may be a color filter substrate and an active switch array substrate. The color filter substrate has a color filter layer. In one embodiment, the color filter layer may be formed on the same substrate as the active switch (Thin Film Transistor, TFT) array substrate.

the prebaking device 100 is defined with a chamber therein, the inner wall of the chamber is defined with an anti-adhesive film (the shaded part in the figure), in side surface of the chamber is defined a window 1021, an air inlet hole 1031 and an air exhaust hole 1051, the window 1021 is also defined with an anti-adhesive film, the air inlet hole 1031 connects an air supply pipe of a hot air system, the air exhaust hole 1051 connects an air exhaust pipe of an exhaust system.

In the embodiments of the present disclosure, the film may be replaced by tearing it off directly and adhering a film to the corresponding position, which is simple, convenient and economic.

In an embodiment of the present disclosure, the prebaking device 100 includes a top plate 101, a bottom plate defined opposite to the top plate 101, a first side plate 102, a second side plate 103, a third side plate 104 defined opposite to the first side plate 102, and a fourth side plate 105 defined opposite to the second side plate 103. The top plate 101, the bottom plate, the first side plate 102, the second side plate 103, the third side plate 104, and the fourth side plate 105 cooperate to form the chamber, the window 1021 is defined in the first side plate 102, the air inlet hole 1031 is used to connect an air supply pipe of the hot air system. The air inlet hole 1031 is defined in the second side plate 103, the air exhaust hole 1051 is used to connect an air exhaust pipe of a hot air system. An air exhaust hole 1051 is defined in the fourth side plate 105, the inner surface of the top plate 101 is defined with the anti-adhere film.

In addition, in other embodiments, the inner wall of the chamber includes a top inner wall and a chamber side wall, both walls are defined with the film.

In the prebake stage of display substrate, when the solvent in the photoresist is removed by directly heating the substrate, a large amount of solvent vapors accumulate in the window 1021 of the prebaking device 100 above the substrate. The intersection of the window 1021 and the top plate 101 is just where cold and heat exchange occurs. The solvent vapors accumulated here are prone to adhere to the inner surface of the top plate 101 when cooled to liquid, causing product defects to the subsequent manufacturer of the product. It is necessary to take away the solvent vapor by hot air and prevent the solvent vapor from liquefying. In addition, an anti-adhesion film is defined on the inner surface of the top plate 101, the volatilized solvent vapor does not adhere to the top plate 101 when display substrate is prebaked to evaporate the photoresist solvent, thereby improving the product yield of display substrate.

Further, the window 1021 is a blind window.

The blind window is a feed port and a discharge port for display substrate to enter and exit the chamber of the prebaking device 100. After display substrate is fed or discharged, the prebaking device 100 is closed with the equipment chamber to ensure that the chamber is isolated from the outside. During baking, the display substrate is placed on the bottom plate in the chamber.

Specifically, each side of the blind window may be defined with an anti-adhesive film, and in this embodiment, optionally, the anti-adhesive film is defined on a side of the blind window facing the chamber.

Further, the temperature that the film resists is greater than or equal to 200° C.

Further, the film is an acid-base resistant film.

Further, the film is made of a material including polytetrafluoroethylene.

Polytetrafluoroethylene is a new composite product having high-performance and multi-purpose. The film supported by PTFE has a smooth surface, good adhesion resistance, chemical corrosion resistance, high temperature resistance and heat resistance (260° C. for a long time, and the maximum temperature can reach 300° C.). It can be used safely even on overheated heaters, and the "slag" of the melted packaging film will not stick to the heaters, and its electrical insulation is excellent.

Or the film is made of a material including polyethylene terephthalate.

The film made of materials including polyethylene terephthalate has smooth surface and strong adhesion, and has the advantages of good viscosity resistance, solvent resistance, acid and alkali resistance, and long-term temperature resistance of 200° C.

The high temperature resistance, acid resistance and alkali resistance of the film enable the prebaking device 100 to have a long service life and a high utilization rate, thereby reducing the production cost.

Further, each amount of the exhaust holes 1051 and the intake holes 1031 is 6, the exhaust holes 1051 are aligned with the intake holes 1031 one by one.

When the solvent vapor is discharged, the hot air system provides hot air to cooperate with the exhaust system to form a stable gas field in the chamber and discharge the solvent vapor from the exhaust hole 1051. The one-to-one alignment of the exhaust holes 1051 and the intake holes 1031 facilitates the discharge of solvent vapor.

The prebaking device 100 for display substrate provided by the disclosure has a chamber inside, the top surface of the chamber is defined with an anti-adhesion film, side surface of the chamber is defined with a window 1021; an air inlet hole 1031, configured to connect an air supply pipe of an hot air system; an air exhaust hole 1051, configured to connect an air exhaust pipe of an air exhaust system. Under the joint action of the hot air system and the air exhaust system, a stable air flow is formed inside the chamber to discharge the photoresist solvent vapor evaporated from display substrate, the top surface of the chamber is defined with an anti-adhesion film, when the prebake display substrate is evaporating the photoresist solvent, the volatilized solvent vapor will not adhere to the top plate, thus improving the product yield of display substrate and reducing the production cost.

Figure 2:
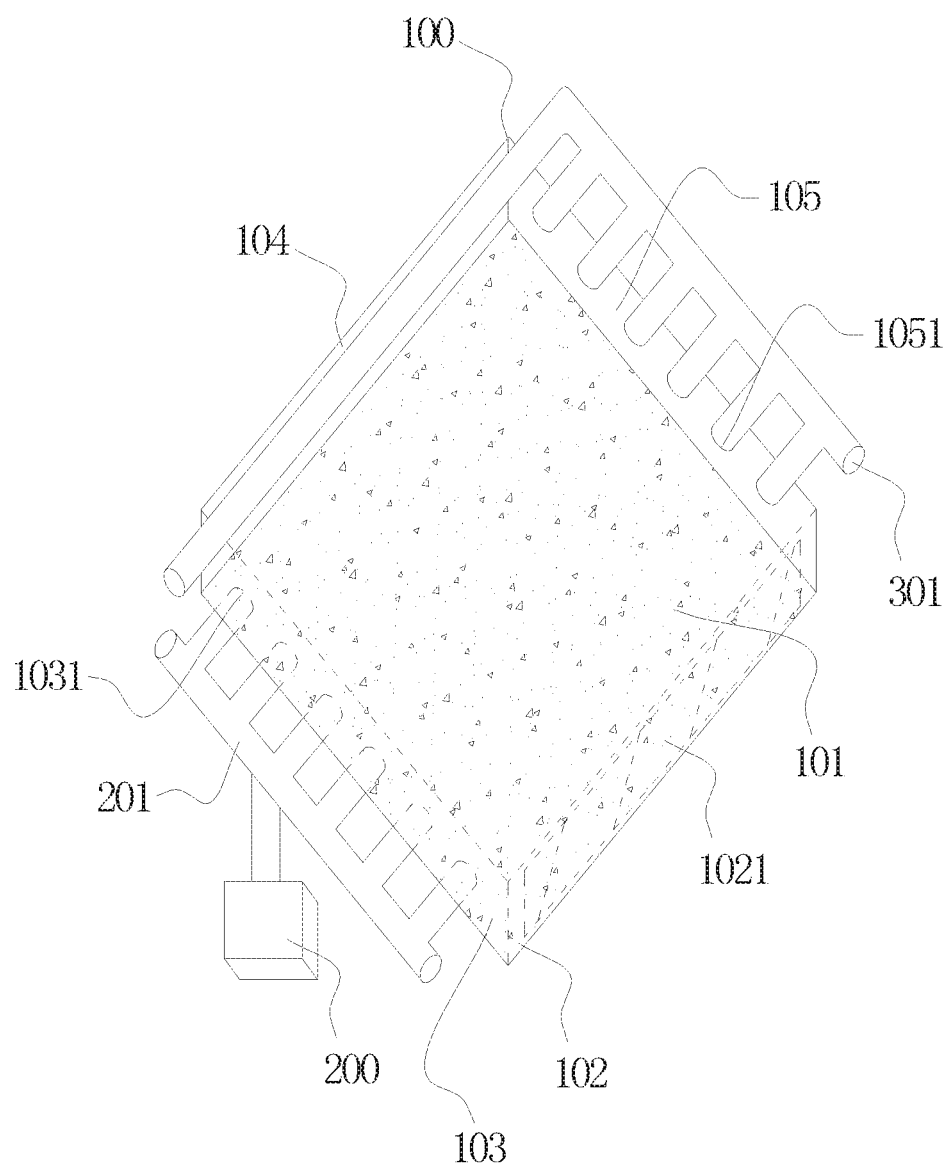
FIG. 2 is a schematic structural diagram of a prebaking system for display substrate provided by an embodiment of the present disclosure.

Referring to FIG. 2, an embodiment of the disclosure also provides a prebaking system for display substrate, the prebaking system includes the prebaking device 100, the hot air system 200, and an air exhaust system, the air supply pipe 201 of the hot air system 200 is connected with the air inlet 1031, the air exhaust pipe 301 of the air exhaust system is connected with the exhaust hole 1051.

The interior of the prebaking device 100 is a chamber, the top surface of the chamber is defined with an anti-adhesive film (the shaded part in the figure), side of the chamber is defined with a window 1021, an air inlet hole 1031 and an air exhaust hole 1051, the air inlet hole 1031 connects an air supply pipe 201 of a hot air system 200, the air exhaust hole 1051 connects an air exhaust pipe 301 of an exhaust system.

In the embodiments of the present disclosure, the prebake device 100 includes a top plate 101, a bottom plate defined opposite to the top plate 101, a first side plate 102, a second side plate 103, a third side plate 104 defined opposite to the first side plate 102, and a fourth side plate 105 defined opposite to the second side plate 103, the top plate 101, the bottom plate, the first side plate 102, the second side plate 103, the third side plate 104, and the fourth side plate 105 cooperate to form the chamber, the window 1021 is defined in the first side plate 102 to connect an air supply pipe 201 of a hot air system 200, the air inlet hole 1031 is defined in the second side plate 103 to connect an air exhaust pipe 301 of an air exhaust system, the air exhaust hole 1051 is defined in the fourth side plate 105, the inner surface of the top plate 101 is defined with the anti-adhere film.

In the prebake stage of display substrate, when the solvent in the photoresist is removed by directly heating the substrate, a large amount of solvent vapors accumulate in the window 1021 of the prebake device 100 above the substrate. The intersection of the window 1021 and the top plate 101 is just where cold and heat exchange occurs. The solvent vapors accumulated here are prone to adhere to the inner surface of the top plate 101 when cooled to liquid, causing product defects to the subsequent manufacturer of the product. It is necessary to take away the solvent vapor by hot air and prevent the solvent vapor from liquefying. In addition, an anti-adhesion film is defined on the inner surface of the top plate 101, the volatilized solvent vapor does not adhere to the top plate 101 when the display substrate is prebaked to evaporate the photoresist solvent, thereby improving the product yield of display substrate.

Further, the window 1021 is a blind window.

The blind window is a feed port and a discharge port for display substrate to enter and exit the interior of the prebake device 100. After display substrate is fed or discharged, the prebake device 100 is closed with the equipment chamber to ensure that the chamber is isolated from the outside.

Further, the temperature that the film resists is greater than or equal to 200° C.

Further, the film is an acid-base resistant film.

Having the high temperature resistance, acid-base resistance, the film enables the prebake device 100 to have a long service life and a high utilization rate, thereby reducing the production cost.

Further, each amount of an air exhaust hole 1051 and the air inlet hole 1031 is 6, the air exhaust hole 1051 is aligned with the air inlet hole 1031 correspondingly.

In other embodiments, each amount of the air exhaust hole 1051 and the air inlet hole 1031 is 10, the air exhaust hole 1051 is aligned with the air inlet hole 1031 correspondingly.

When the solvent vapor is discharged, the hot air system 200 provides hot air, cooperating the exhaust system to form a stable gas field in the chamber and to discharge the solvent vapor from the exhaust hole 1051. The air exhaust hole 1051 aligns the air inlet hole 1031 correspondingly, facilitating the discharge of solvent vapors.

The prebaking system for display substrate provided by the disclosure includes a prebaking device 100, a hot air system 200 and an air exhaust system, the interior of the prebaking device 100 is a chamber, the top surface of the chamber is defined with an anti-adhesion film, side surface of the chamber is defined with a window 1021; an air inlet hole 1031, configured to connect an air supply pipe 201 of a hot air system 200; an air exhaust hole 1051, configured to connect an air exhaust pipe 301 of an air exhaust system. Under the joint action of the hot air system 200 and the air exhaust system, a stable air flow is formed inside the chamber to discharge the photoresist solvent vapor evaporated from display substrate, the top surface of the chamber is defined with an anti-adhesion film, when display substrate is prebaking to evaporate the photoresist solvent, the volatilized solvent vapor will not adhere to the top plate, thus improving the product yield of display substrate and reducing the production cost.

An embodiment of the disclosure also provides a prebaking system for display substrate, the prebaking system includes a hot air system; an air exhaust system; a prebaking device, the prebaking device is defined with a chamber formed in it, the inner wall of the chamber is defined with an anti-adhesive film, on side surface of the chamber are defined the following:
a window, the surface of the window being defined with an anti-adhesive film;
an air inlet hole, configured to connect an air supply pipe of a hot air system;
an air exhaust hole, configured to connect an air exhaust pipe of an exhaust system.
each amount of the air exhaust hole and the air inlet hole is 6, each air exhaust hole is aligned with one air inlet hole correspondingly, the window is a blind window, the film has acid-base resistance and electrical isolation, and the temperature that the film resists is greater than or equal to 200° C.

Further, the film is made of a material including polytetrafluoroethylene.

Polytetrafluoroethylene is a new composite product having high-performance and multi-purpose. The film supported by PTFE has a smooth surface, good adhesion resistance, chemical corrosion resistance, high temperature resistance and heat resistance (260° C. for a long-term use, and the maximum temperature can reach 300° C.). It can be used safely even on overheated heaters, the "slag" of the melted packaging film will not stick to the heaters, and its electrical insulation is excellent.

Or the film is made of a material including polyethylene terephthalate.

The film made of a material including polyethylene terephthalate has smooth surface and strong adhesion, and has the advantages of good adhesion resistance, solvent resistance, acid-base resistance, and long-term temperature resistance of 200° C.

The prebaking system for display substrate of the embodiment of the present disclosure, the surface of the inner wall of the chamber of the prebaking device is defined with an anti-adhesion film, when the prebake display substrate is evaporating the photoresist solvent, the volatilized solvent vapor will not adhere to the top plate, thus improving the product yield of display substrate and reducing the production cost.

It should be noted that in the above-mentioned embodiments, the description of each embodiment has its own emphasis. For those parts of an embodiment that are not described in detail, please refer to the relevant descriptions of other embodiments.

The foregoing are only specific embodiments of the present disclosure without limit to the protection scope of the present disclosure, and any equivalent modifications or substitutions obvious to the skilled in the art based on the present disclosure are within the protection scope of the present disclosure. Therefore, the protection scope of the present disclosure should be determined by the claims.

What is claimed is:

1. A prebaking device for display substrate, wherein the prebaking device defines a chamber therein, the inner wall of the chamber is defined with an anti-adhesive film, wherein the inner wall of the chamber comprises a top inner wall and a chamber side wall both defined with the anti-adhesive film, a side surface of the chamber is defined with:
a window, the surface of the window being defined with the anti-adhesive film;
an air inlet hole, being configured to connect an air supply pipe of a hot air system;
an air exhaust hole, being configured to connect an air exhaust pipe of an air exhaust system; and
wherein each air exhaust hole is aligned with one air inlet hole correspondingly;
under a joint action of the hot air system and the air exhaust system, a stable air flow is formed inside the chamber to discharge photoresist solvent vapor evaporated from the display substrate.

2. The prebaking device according to claim 1, comprising:
a bottom plate;
a top plate, defined opposite to the bottom plate, the anti-adhesive film being defined on the inner surface of the top plate;
a first side plate, the window being defined in the first side plate;
a second side plate, connecting the top plate, the bottom plate, and the first side plate, the air inlet hole being defined in the second side plate;
a third side plate, defined opposite to the first side plate, and connecting the top plate, the bottom plate, the first side plate, and the second side plate; and
a fourth side plate, defined opposite to the second side plate, the fourth side plate cooperating with the top plate, the bottom plate, the first side plate, the second side plate, and the third side plate to form the chamber, the air exhaust hole being defined in the fourth side plate.

3. The prebaking device according to claim 2, wherein each amount of the air exhaust hole and the air inlet hole is preset.

4. The prebaking device according to claim 1, wherein the anti-adhesive film is an acid-base resistant film.

5. The prebaking device according to claim 1, wherein the anti-adhesive film is made of a material comprising polytetrafluoroethylene or a material comprising polyethylene terephthalate.

6. The prebaking device according to claim 1, wherein the temperature resistance of the anti-adhesive film is greater than or equal to 200° C.

7. The prebaking device according to claim 1, wherein the window is a blind window, a side of the blind window facing the chamber is defined with the anti-adhesive film.

8. The prebaking device according to claim 1, wherein the temperature resistance of the anti-adhesive film is 300° C.

9. A prebaking system for display substrate, comprising:
a hot air system;
an air exhaust system; and
a prebaking device, the prebaking device defining a chamber therein, the inner wall of the chamber being defined with an anti-adhesive film, wherein the inner wall of the chamber comprises a top inner wall and a chamber side wall both defined with the anti-adhesive film, a side surface of the chamber being defined with:
a window, the surface of the window being defined with the anti-adhesive film;
an air inlet hole, being configured to connect an air supply pipe of the hot air system;
an air exhaust hole, being configured to connect an air exhaust pipe of the air exhaust system; and
wherein each air exhaust hole is aligned with one air inlet hole correspondingly;
under a joint action of the hot air system and the air exhaust system, a stable air flow is formed inside the chamber to discharge photoresist solvent vapor evaporated from the display substrate.

10. The prebaking system according to claim 9, comprising:
a bottom plate, used for bearing the display substrate;
a top plate, defined opposite to the bottom plate, the anti-adhesive film being defined on the inner surface of the top plate;
a first side plate, the window being defined in the first side plate;
a second side plate, connecting the top plate, the bottom plate, and the first side plate, the air inlet hole being defined in the second side plate;
a third side plate, defined opposite to the first side plate, and connecting the top plate, the bottom plate, the first side plate, and the second side plate;
a fourth side plate, defined opposite to the second side plate, the fourth side plate cooperating with the top plate, the bottom plate, the first side plate, the second side plate, and the third side plate to form the chamber, the air exhaust hole being defined in the fourth side plate.

11. The prebaking system according to claim 10, wherein each amount of the air exhaust hole and the air inlet hole is preset.

12. The prebaking system according to claim 9, wherein the anti-adhesive film is an acid-base resistant film.

13. The prebaking system according to claim 9, wherein the anti-adhesive film is made of a material comprising polytetrafluoroethylene.

14. The prebaking system according to claim 9, wherein the anti-adhesive film is made of a material comprising polyethylene terephthalate.

15. The prebaking system according to claim 9, wherein the temperature resistance of the anti-adhesive film is greater than or equal to 200° C.

16. The prebaking system according to claim 9, wherein the temperature resistance of the anti-adhesive film is 300° C.

17. The prebaking system according to claim 9, wherein the window is a blind window, a side of the blind window facing the chamber is defined with the anti-adhesive film.

18. A prebaking system for display substrate, comprising:
a hot air system;
an air exhaust system;
a prebaking device, the prebaking device defining a chamber therein, the inner wall of the chamber being defined with an anti-adhesive film, wherein the inner wall of the chamber comprises a top inner wall and a chamber side wall both defined with the anti-adhesive film, a side surface of the chamber being defined with:
a window, the surface of the window being defined with the anti-adhesive film;
an air inlet hole, being configured to connect an air supply pipe of the hot air system; and
an air exhaust hole, being configured to connect an air exhaust pipe of the air exhaust system;
wherein each amount of the air exhaust hole and the air inlet hole is preset, each air exhaust hole is aligned with one air inlet hole correspondingly, the window is a blind window, a side of the blind window facing the chamber is defined with the anti-adhesive film, the anti-adhesive film has acid-base resistance and is electrical isolation, and the resistance temperature of the anti-adhesive film is greater than or equal to 200° C.;

under a joint action of the hot air system and the air exhaust system, a stable air flow is formed inside the chamber to discharge photoresist solvent vapor evaporated from the display substrate.

\* \* \* \* \*